United States Patent
Sohn et al.

(10) Patent No.: US 7,864,622 B2
(45) Date of Patent: *Jan. 4, 2011

(54) LOW POWER MULTI-CHIP SEMICONDUCTOR MEMORY DEVICE AND CHIP ENABLE METHOD THEREOF

(75) Inventors: Dong-Woo Sohn, Hwaseong-si (KR); Ji-Ho Cho, Suwon-si (KR); Myong-Jae Kim, Suwon-si (KR); Won-Ju Lee, Seongnam-si (KR); Jong-Mun Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/099,292

(22) Filed: Apr. 8, 2008

(65) Prior Publication Data

US 2008/0212391 A1 Sep. 4, 2008

Related U.S. Application Data

(63) Continuation of application No. 11/802,160, filed on May 21, 2007, now Pat. No. 7,379,380, which is a continuation of application No. 11/296,493, filed on Dec. 8, 2005, now Pat. No. 7,236,423.

(30) Foreign Application Priority Data

Dec. 10, 2004 (KR) ............ 10-2004-0104202

(51) Int. Cl.
*G11C 8/00* (2006.01)
(52) U.S. Cl. .............. 365/230.08; 365/230.06; 365/229; 365/189.07; 365/189.02
(58) Field of Classification Search .......... 365/230.08, 365/230.06, 229, 189.07, 189.02, 230.09
See application file for complete search history.

(56) References Cited

U.S. PATENT DOCUMENTS

| | | | |
|---|---|---|---|
| 6,347,394 B1 | 2/2002 | Ochoa et al. | |
| 6,373,752 B1 | 4/2002 | Wright et al. | |
| 6,768,660 B2 | 7/2004 | Kong et al. | |
| 6,937,496 B2 | 8/2005 | Mizuno et al. | |
| 7,057,964 B2 | 6/2006 | Hong et al. | |
| 7,122,906 B2 * | 10/2006 | Doan ................. | 257/778 |
| 7,133,798 B1 | 11/2006 | Ong | |
| 7,173,865 B1 * | 2/2007 | Ansel et al. ............ | 365/191 |
| 7,184,340 B2 | 2/2007 | Lim | |
| 7,236,423 B2 * | 6/2007 | Sohn et al. ........... | 365/230.08 |
| 2004/0136218 A1 | 7/2004 | Magnavacca et al. | |
| 2007/0076479 A1 * | 4/2007 | Kim et al. ............. | 365/185.11 |
| 2007/0153576 A1 * | 7/2007 | Oh et al. ............... | 365/185.11 |

FOREIGN PATENT DOCUMENTS

| | | |
|---|---|---|
| JP | 52116119 | 9/1977 |
| JP | 61296592 A | 12/1986 |

(Continued)

*Primary Examiner*—Tuan T. Nguyen
(74) *Attorney, Agent, or Firm*—Volentine & Whitt, PLLC

(57) ABSTRACT

A multi-chip semiconductor device capable of selectively activating and deactivating the individual semiconductor chips of the device and a chip enable method thereof are included. The individual semiconductor chips of the device are activated and deactivated in accordance with internal chip enable signals.

16 Claims, 5 Drawing Sheets

FOREIGN PATENT DOCUMENTS

| | | |
|---|---|---|
| JP | 62118557 A | 5/1987 |
| JP | 63168895 A | 7/1988 |
| JP | 03147351 | 6/1991 |
| JP | 07319765 | 12/1995 |
| JP | 11120075 A | 4/1999 |
| JP | 2003007963 | 1/2003 |
| JP | 2003068079 | 3/2003 |
| KR | 1020030071027 A | 9/2003 |

* cited by examiner

LOW POWER MULTI-CHIP SEMICONDUCTOR MEMORY DEVICE AND CHIP ENABLE METHOD THEREOF

CROSS-REFERENCE TO RELATED APPLICATION

This application is a continuation of U.S. patent application Ser. No. 11/802,160, filed May 21, 2007, which is a continuation of U.S. patent application Ser. No. 11/296,493, filed on Dec. 8, 2005 (issued on Jun. 26, 2007 as U.S. Pat. No. 7,236,423), which claims priority to Korean patent application number 10-2004-0104202, filed Dec. 10, 2004. The subject matter of these applications is hereby incorporated by reference.

BACKGROUND OF THE INVENTION

1. Field of the Invention

Embodiments of the invention relate to a multi-chip semiconductor memory device with a plurality of memory chips built into one package and a related method of selectively enabling a memory chip within the device.

2. Description of the Related Art

The demand for small and diverse mobile devices such as PDAs, 3G mobile phones, digital still cameras, etc., has long been met by increasing the integration density and therefore reducing the size of the constituent components of semiconductor devices. However, continued reduction in the size of the constituent components in order to achieve even higher integration densities for contemporary semiconductor devices becomes increasingly difficult and is characterized by high cost and large amounts of development time. Accordingly, multi-chip packaging technology has recently been used in such mobile applications as an alternative to the use of increasingly dense semiconductor devices. A multi-chip package generally comprises several chips (e.g., memory chips, such as NOR flash memory chips, NAND flash memory chips, SRAM chips, UtRAM chips, etc.) mounted in a single package. In general, a multi-chip package has a structure in which two, four, or more homogeneous memory chips are vertically stacked one on top of the other. Thus, semiconductor devices formed using multi-chip package technology can reduce the semiconductor device mounting area within a host device by 50% or more, as compared with the use of separate semiconductor devices.

However, the presence of multiple chips within a multi-chip package results in the use of numerous pins (e.g., address pins, control pins, data I/O pins, etc.). This "high pin count" makes it difficult to construct a multi-chip package system. To address this problem, a plurality of memory chips in the multi-chip package may be arranged to share external pins. Unfortunately, the sharing of external pins by a plurality of memory chips within a multi-chip package generally precludes the use of a chip selection function.

FIG. 1 is a schematic diagram of a conventional multi-chip package, i.e., a dual die package (DDP) comprising a stacked arrangement of two homogenous chips in a single package. FIG. 2 is a timing diagram illustrating an operation of the conventional multi-chip package shown in FIG. 1.

Referring to FIG. 1, semiconductor chips 10 and 20 (which may be, for example, NOR flash memory chips, NAND flash memory chips, SRAM chips, UtRAM chips, etc.) are mounted in one package. An external chip enable signal nCEx activates semiconductor chips 10 and 20 for operation. In this case, although only one semiconductor chip will actually operate after the given external chip enable signal nCEx, both of semiconductor chips 10 and 20 are activated. Although it is not required to operate, the "not-to-be-selected" semiconductor chip nonetheless is still activated and dissipates power accordingly. A method of effectively avoiding this circumstance and thereby reducing the power dissipation of a multi-chip semiconductor package would be beneficial.

SUMMARY OF THE INVENTION

In one embodiment, the invention provides a multi-chip semiconductor memory device comprising a plurality of semiconductor chips integrated into a single package and sharing at least one I/O pin, a chip enable buffer operatively associated with at least one of the plurality of semiconductor chips and configured to generate an internal chip enable signal in response to an external chip enable signal, an external address, and chip identification (ID) information, and a logic control device operatively associated with at least one of the plurality of semiconductor chips and the chip enable buffer and configured to activate one of the plurality of semiconductor chips in response to the internal chip enable signal, such that the semiconductor chips in the plurality of semiconductor chips other than the activated semiconductor chip are deactivated semiconductor chips.

In another embodiment, the invention provides a semiconductor chip adapted for use in a multi-chip semiconductor memory device comprising a chip enable buffer that comprises a chip selector configured to compare an external address signal with chip ID information, and a signal generator configured to generate an activating or deactivating internal chip enable signal in accordance with an external chip enable signal and provide the internal chip enable signal to the semiconductor chip, wherein the semiconductor chip is activated upon receiving the activating internal chip enable signal and is deactivated upon receiving the deactivating internal chip enable signal.

In yet another embodiment, the invention provides a chip enable method for a multi-chip semiconductor memory device comprising a plurality of semiconductor chips integrated into a single package and sharing at least one I/O pin, the method comprising generating an internal chip enable signal for each of the plurality of semiconductor chips in response to an external chip enable signal, an external address signal, and chip ID information, activating one of the plurality of semiconductor chips in accordance with the internal chip enable signals, and deactivating the remaining ones of the plurality of semiconductor chips in accordance with the internal chip enable signals.

BRIEF DESCRIPTION OF THE DRAWINGS

Exemplary embodiments of the invention will be described with reference to the accompanying drawings, in which like reference symbols indicate like or similar elements. In the drawings.

DESCRIPTION OF THE EXEMPLARY EMBODIMENTS

Exemplary embodiments of the invention will now be described with reference to the accompanying drawings.

A low power, multi-chip semiconductor device and a related chip enable method are described in the context of these embodiments. In use, these embodiments are characterized by generating internal chip enable signals in response to an external chip enable signal, an external address signal, and chip identification (ID) information of each of the plurality of semiconductor chips in the device, and then activating one of the semiconductor chips in response to one of the internal chip enable signal. The other semiconductor chips in the multi-chip device remain deactivated. Consequently, non-selected semiconductor chip(s) that do not actually operate during a given operation cycle remain deactivated. Thus, power dissipation is effectively reduced relative to conventional multi-chip semiconductor devices.

Figure 1:
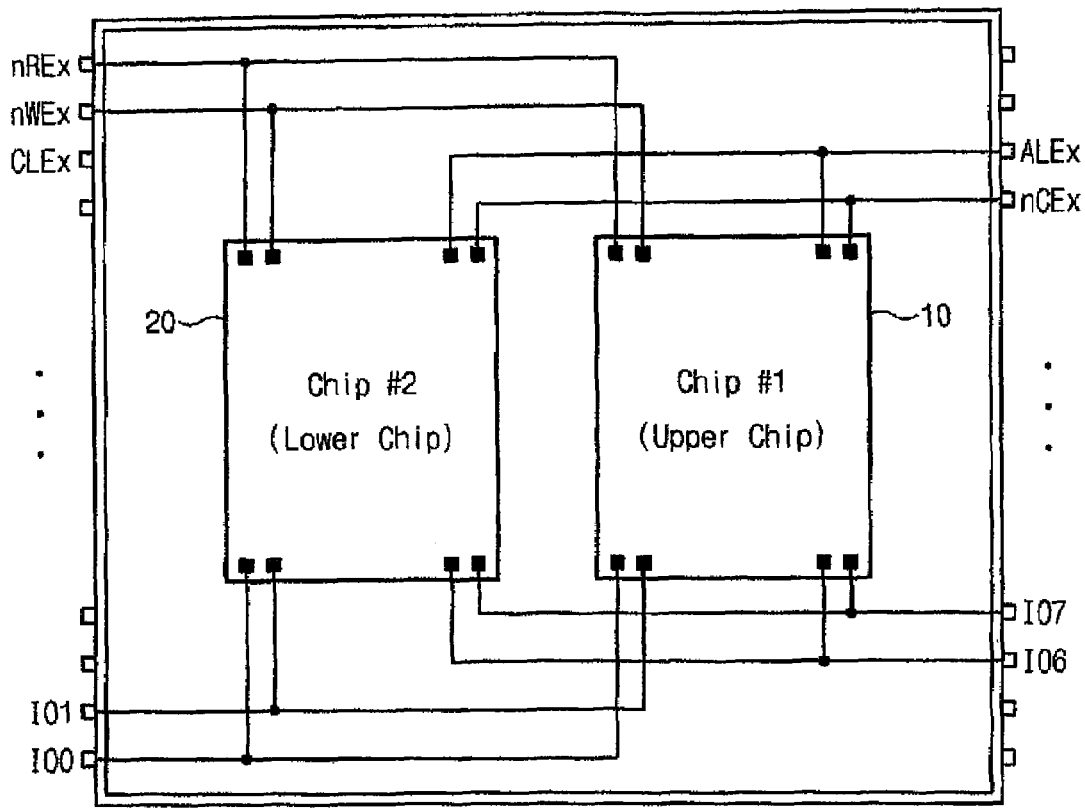
FIG. 1 is a schematic diagram of a conventional multi-chip package.
Figure 2:
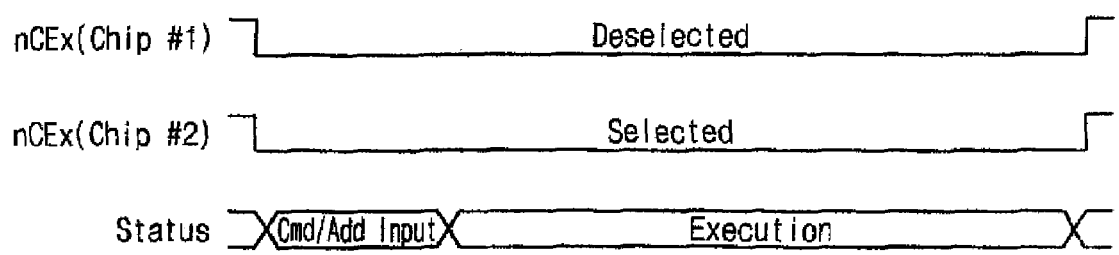
FIG. 2 is a timing diagram illustrating an operation of the multi-chip package shown in FIG. 1.
Figure 3:
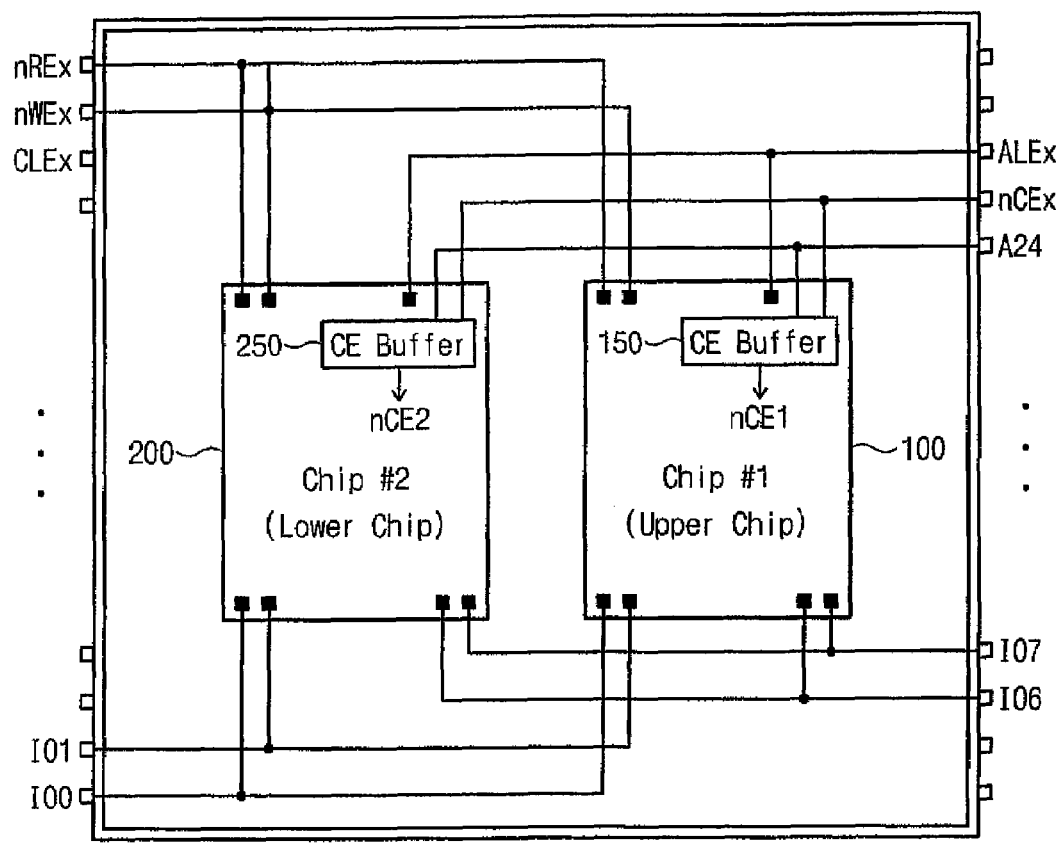
FIG. 3 is a schematic diagram of a multi-chip package in accordance with an exemplary embodiment of the invention.

FIG. 3 is a schematic diagram of a multi-chip package in accordance with an exemplary embodiment of the present invention. Although a package comprising only two semiconductor chips is illustrated in FIG. 3, it will be apparent to those of ordinary skill in the art that a package might otherwise include additional semiconductor chips. The present invention may also be applied to a multi-chip package comprising a plurality of heterogeneous semiconductor chips, as well as to a multi-chip package comprising a plurality of homogeneous semiconductor chips.

The multi-chip package illustrated in FIG. 3 includes semiconductor chips 100 and 200. Semiconductor chips 100 and 200 are integrated into a single multi-chip package and share at least one I/O pin. Semiconductor chip 100 is associated with (and may integrally comprise) a control logic device (not shown) and a chip enable buffer 150. Semiconductor chip 200 is similarly associated with a (separate or unitary) control logic device (not shown) and a chip enable buffer 250. Separate chip enable buffers, integrally formed within each semiconductor device are shown in the illustrated example, but might otherwise be provided, separately or unitarily, external to the semiconductor devices.

Chip enable buffers 150 and 250 each receive external chip enable signal nCEx and external address signal A24 and generate internal chip enable signals nCE1 and nCE2, respectively. In the illustrated example, the control logic device associated with semiconductor chip 100 activates or deactivates semiconductor chip 100 in response to the internal chip enable signal nCE1, and the control logic device associated with semiconductor chip 200 activates or deactivates semiconductor chip 200 in response to the internal chip enable signal nCE2.

As described in some additional detail below, chip enable buffers 150 and 250 each contain unique chip ID information and chip operation mode information for their respective chips, as chip ID information and chip operation mode information are set within each chip. Each of chip enable buffers 150 and 250 generates an internal chip enable signal in accordance with external chip enable signal nCEx, external address signal A24, chip operation mode information Fmulti, and chip ID information FCS. If a given semiconductor chip will operate, that semiconductor chip's chip enable buffer will generate an activating internal chip enable signal. Simultaneously, the chip enable buffer of the remaining semiconductor chip, which will not operate, will generate a deactivating internal chip enable signal. Consequently, the power consumption of the multi-chip package is reduced relative to conventional multi-chip packages by deactivating the chip that will not operate.

In this example, chip ID information FCS of a semiconductor chip indicates whether or not the semiconductor chip is an upper chip or a lower chip. Chip ID information FCS may also indicate the position of the semiconductor chip among a plurality of semiconductor chips when the multi-chip package is comprises more than two chips. Chip operation mode information Fmulti indicates whether or not the multi-chip package operates in multi-chip mode. Multi-chip mode is an operation mode wherein a plurality of semiconductor chips operate as one semiconductor chip.

Figure 4:
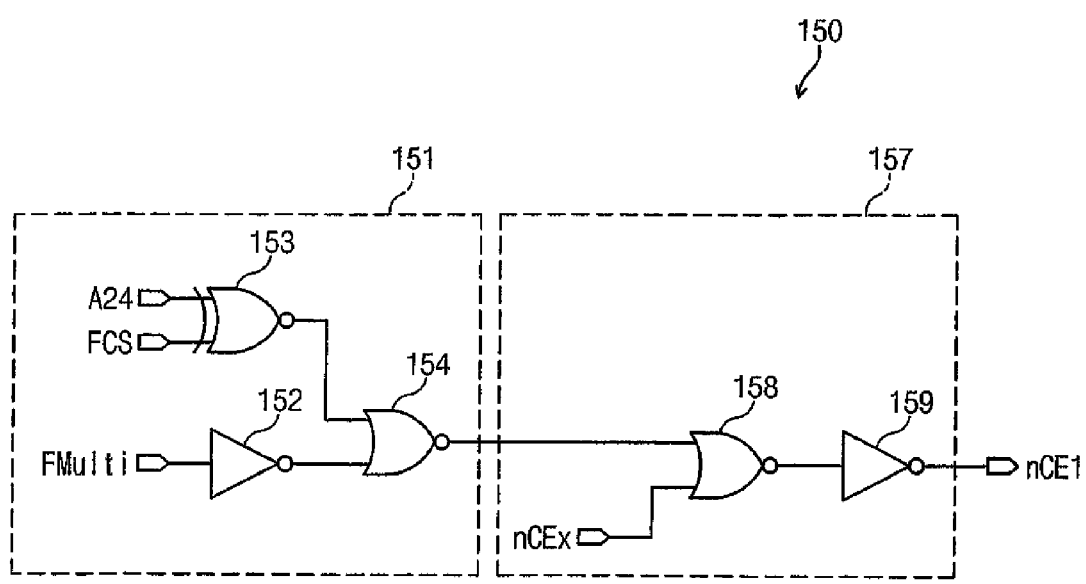
FIG. 4 is a circuit diagram of a chip enable buffer shown in FIG. 3.

FIG. 4 is a circuit diagram of an exemplary chip enable buffer 150 of semiconductor chip 100 shown in FIG. 3.

Referring to FIG. 4, chip enable buffer 150 includes a chip selector 151 and a signal generator 157. Chip selector 151 compares external address signal A24 with chip ID information FCS. Thereafter, chip selector 151 compares the result of the above comparison with chip operation mode information Fmulti of semiconductor chip 100 and outputs the result. Signal generator 157 generates and provides an internal chip enable signal to semiconductor chip 100 in response to external chip enable signal nCEx and the result provided by chip selector 151. Signal generator 157 will provide either an activating or deactivating internal chip enable signal to semiconductor chip 100.

The respective structure and operation of exemplary chip selector 151 and signal generator 157 will now be described in detail with reference to FIG. 4.

Chip selector 151 includes a first inverter 152, an XNOR gate 153, and a first NOR gate 154.

First inverter 152 inverts chip operation mode information Fmulti of the multi-chip package and provides the result to first NOR gate 154. Chip operation mode information Fmulti indicates whether or not the multi-chip package operates in multi-chip mode, and is set by a bonding or fuse option. When the multi-chip package operates in multi-chip mode, chip operation mode information Fmulti may, for example, be set to a value of logic "HIGH" (or 1). Alternatively, when the multi-chip package operates in single-chip mode, chip operation mode information Fmulti may be set to a value of logic "LOW" (or 0). Single-chip mode is an operation mode in which the semiconductor chips of the multi-chip package are used individually.

XNOR gate 153 receives and performs a logical XNOR operation on external address signal A24 and chip ID information FCS. External address signal A24 is received from the 24th address pin of the multi-chip package, and represents the most significant bit (MSB) of the address of either semiconductor chip 100 or semiconductor chip 200. For example, when external address signal A24 represents the MSB of the upper chip, semiconductor chip 100, external address signal A24 has a value of logic "HIGH" (or 1). Alternatively, when external address signal A24 represents the MSB of the lower chip, semiconductor chip 200, external address signal A24 has a value of logic "LOW" (or 0). External address signal A24 is received from a host.

Each semiconductor chip has a unique value for chip ID information FCS, which is set by a bonding or fuse option. For example, chip ID information FCS of semiconductor chip 100 is set as a value of logic "HIGH" (or 1) and chip ID information FCS of semiconductor chip 200 is set as a value of logic "LOW" (or 0).

When the multi-chip package is equipped with four semiconductor chips, XNOR gate 153 receives a 2-bit external address signal made up of individual 1-bit external address signals A23 and A24, and uses the 2-bit external address signal to discriminate among the four semiconductor chips. For example, external address signals A23 and A24 may, when taken together, have a value of "11" when representing the highest chip, "10" when representing the second highest chip, "01" when representing the third highest chip, and "00" when representing the lowest chip.

Chip ID information FCS may also be represented by a plurality of bits, wherein the number of bits used is in accordance with the number of chips included in the multi-chip package. Chip ID information FCS may represent the chips in a manner similar to that described above with reference to the 2-bit external address signal. For example, when the multi-chip package is equipped with four semiconductor chips, chip ID information FCS of the highest chip may have a value of "11", chip ID information FCS of the second highest chip may have a value of "10", chip ID information FCS of the third highest chip may have a value of "01", and chip ID information FCS of the lowest chip may have a value of "00".

When external address signal A24 is equivalent to chip ID information FCS, XNOR gate 153 outputs a value of logic "HIGH" (or 1). The logical XNOR operation of XNOR gate 153 determines whether or not the address of the memory chip that will be activated for operation is equivalent to the unique ID information of semiconductor chip 100. The result of the logical XNOR operation performed by XNOR gate 153 is provided to first NOR gate 154.

First NOR gate 154 receives and performs a logical NOR operation on the inverted chip operation mode information Fmulti provided by first inverter 152, and the result of the logical XNOR operation performed by XNOR gate 153. The result of the logical NOR operation performed by first NOR gate 154 is provided to signal generator 157.

Signal generator 157 includes a second NOR gate 158 and a second inverter 159. Second NOR gate 158 receives and performs a logical NOR operation on external chip enable signal nCEx and the result of the logical NOR operation performed by first NOR gate 154. Second inverter 159 receives and inverts the result of the logical NOR operation performed by second NOR gate 158. The result produced by second inverter 159 is output as internal chip enable signal nCE1.

In this exemplary embodiment, an activating internal chip enable signal is generated only in a semiconductor chip that has received an external address signal A24 that is equivalent to its chip ID information, whereas a deactivating internal chip enable signal is generated in the remaining semiconductor chip.

When the multi-chip package operates in multi-chip mode, a relatively low amount of power is applied to a semiconductor chip that has received a deactivating internal chip enable signal. A semiconductor chip to which a relatively low amount of power is applied enters a standby state (or a low-power mode). When the multi-chip package operates in single-chip mode, no power is applied to a semiconductor chip that has received a deactivating internal chip enable signal. Consequently, under either mode of operation the power consumption of the multi-chip package of this exemplary embodiment is less than the power consumption of conventional multi-chip packages.

Figure 5A:
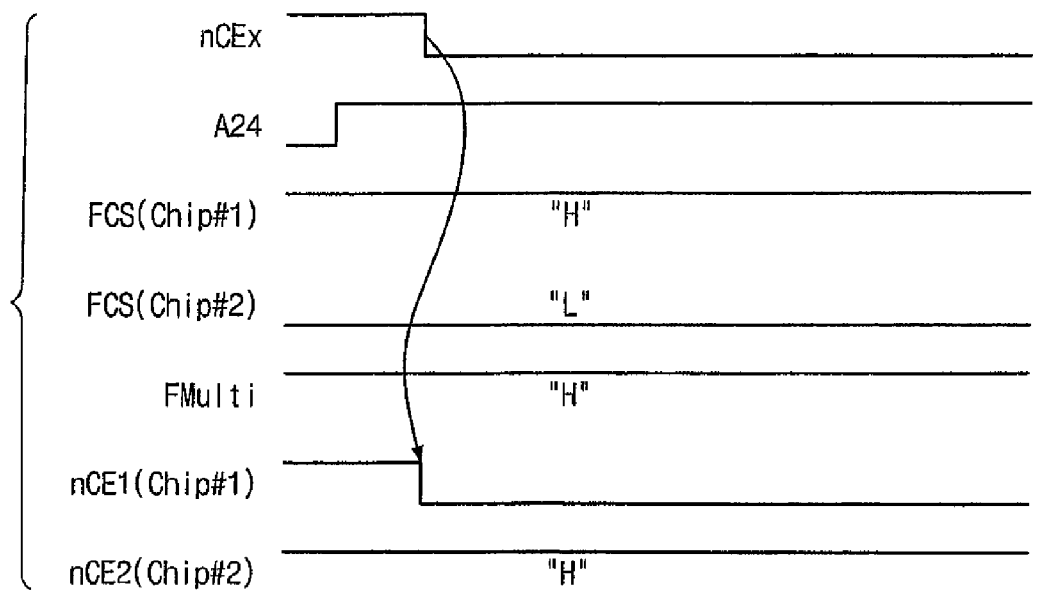
FIGS. 5A and 5B are timing diagrams illustrating operations of the chip enable buffers shown in FIG. 3.
Figure 5B:
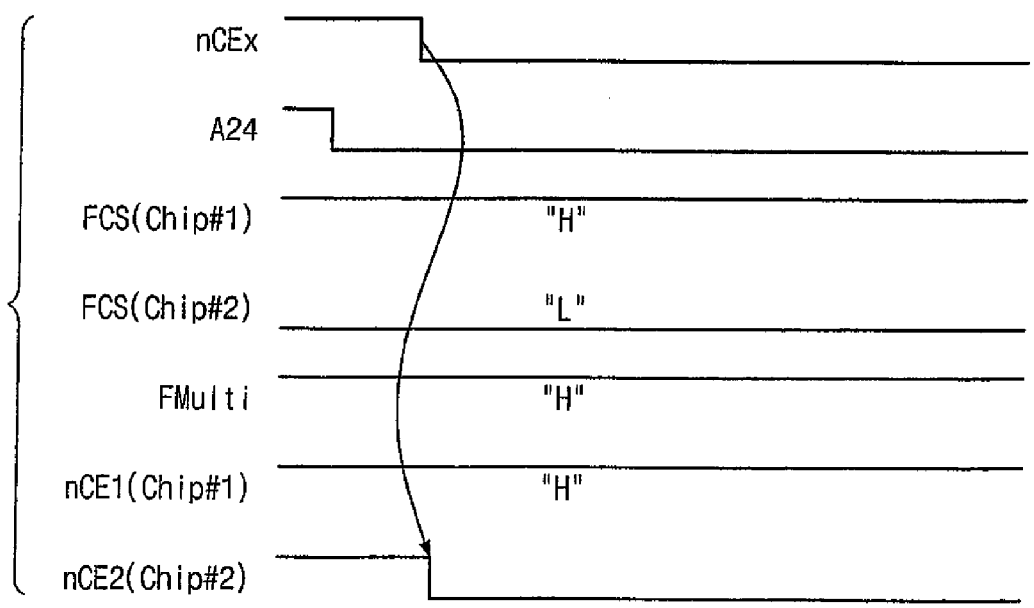

FIGS. 5A and 5B are timing diagrams illustrating operations of the chip enable buffers shown in FIG. 3.

Referring to FIGS. 5A and 5B, when the external chip enable signal nCEx has a value of logic LOW, a LOW (or activating) internal chip enable signal is generated only within the semiconductor chip that has received an external address signal A24 that is equivalent to its chip ID information FCS. According to this chip enable scheme, an activating internal chip enable signal is applied only to the semiconductor chip that will operate. The remaining semiconductor chip, which will not operate, will receive a deactivating internal chip enable signal. Consequently, the power consumption of the multi-chip package of this exemplary embodiment is less than the power consumption of conventional multi-chip packages, as described previously.

Figure 6:
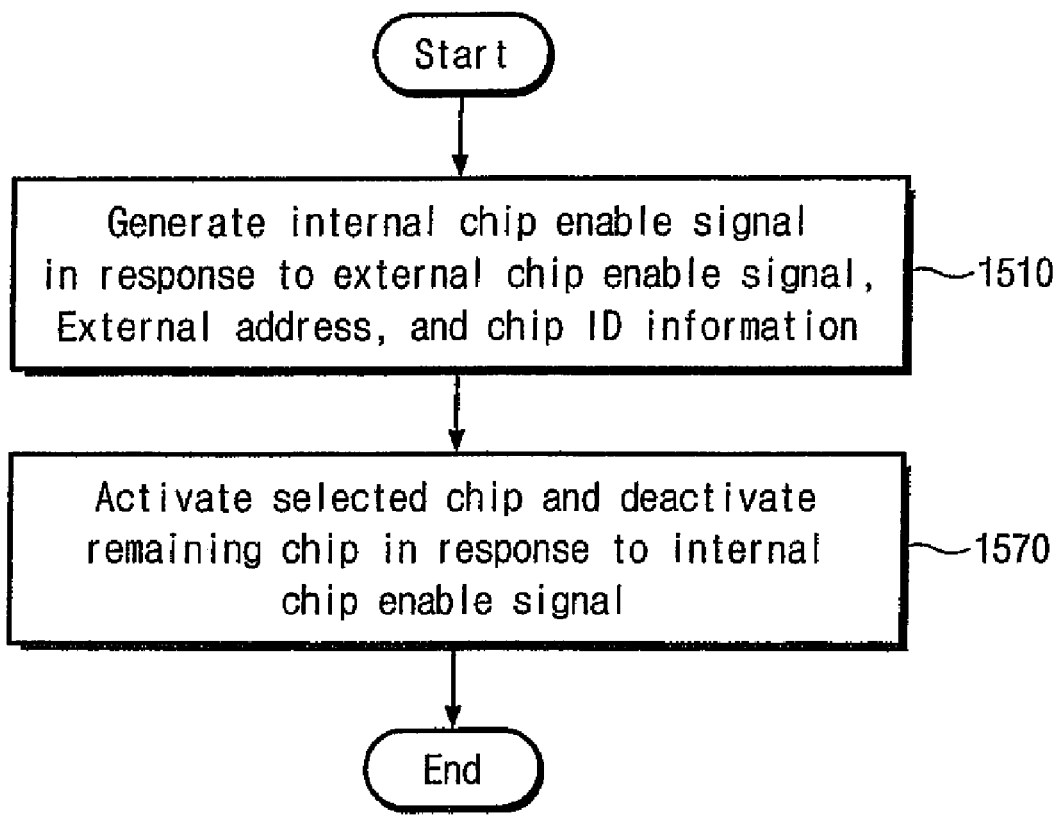
FIG. 6 is a flowchart illustrating a chip enable method for a multi-chip package in accordance with an exemplary embodiment of the invention.

FIG. 6 is a flowchart illustrating a method for enabling chips of the multi-chip package according to an exemplary embodiment of the present invention.

Referring to FIG. 6, the illustrated chip enable method comprises generating internal chip enable signals nCE1 and nCE2 in response to external chip enable signal nCEx, external address signal A24, and chip ID information FCS of semiconductor chips 100 and 200, respectively (1510).

The chip enable method further comprises activating the selected chip, and deactivating the remaining chip in accordance with the internal chip enable signals (1570). For example, when semiconductor chip 100 is selected for operation, an activating internal chip enable signal nCE1 is provided to semiconductor chip 100, and a deactivating internal chip enable signal nCE2 is provided to semiconductor chip 200. Alternatively, when semiconductor chip 200 is selected for activation, an activating internal chip enable signal nCE2 is provided to semiconductor chip 200, and a deactivating internal chip enable signal nCE1 is provided to semiconductor chip 100.

When the multi-chip package operates in multi-chip mode, a semiconductor chip that receives a deactivating internal chip enable signal enters a standby state (or a low-power mode). Alternatively, when the multi-chip package operates in single-chip mode, no power is applied to a semiconductor chip that receives a deactivating internal chip enable signal. Consequently, using the method of FIG. 6, the power consumption of the multi-chip package may be effectively reduced relative to the using conventional multi-chip packages.

As described above, in a multi-chip semiconductor memory device composed of a plurality of semiconductor chips sharing at least one I/O pin, the power dissipation of a semiconductor chip that will not operate may be effectively reduced relative to conventional multi-chip semiconductor memory devices.

While the invention has been described in relation to several exemplary embodiments, it is not intended to be limited to only these teaching examples. Rather the scope of the invention, as defined by the attached claims, encompasses modifications, extensions, and variations of the illustrative embodiments that will be apparent to those of ordinary skill in the art.

What is claimed is:

1. A mobile device comprising:
a multi-chip semiconductor memory device including a plurality of semiconductor chips, each semiconductor chip being selectively activated in response to an internal chip enable signal, and at least one chip enable buffer configured to generate the internal chip enable signal; and
a logic control device operatively associated with at least one of the plurality of semiconductor chips and the at least one chip enable buffer, the logical control device being configured to activate one of the plurality of semiconductor chips in response to the internal chip enable signal, such that the semiconductor chips in the plurality of semiconductor chips other than the activated semiconductor chip are deactivated semiconductor chips, wherein the at least one chip enable buffer is operatively associated with at least one of the plurality of semiconductor chips and configured to generate the internal chip enable signal in response to an external chip enable signal, an external address, chip identification (ID) information, and operation mode information indicating whether the plurality of semiconductor chips operates in a multi-chip mode or a single-chip mode.

2. The mobile device of claim 1, wherein the at least one chip enable buffer comprises a plurality of chip enable buffers, such that each one of the plurality of semiconductor chips integrally incorporate a respective chip enable buffer.

3. The mobile device of claim 1, wherein the external address comprises most significant bits associated with respective semiconductor chips in the plurality of semiconductor devices.

4. The mobile device of claim 1, wherein the chip ID information is set by a bonding or fuse option.

5. The mobile device of claim 1, wherein the chip ID information indicates a position of at least one semiconductor chip within the plurality of semiconductor chips.

6. The mobile device of claim 1, wherein the chip ID information is set within each of the semiconductor chips with a different logic value.

7. The mobile device of claim 1, wherein the deactivated semiconductor chips enter or remain in a standby state.

8. The mobile device of claim 1, wherein the logic control device is further configured to deactivate each one of the deactivated semiconductor chips in response to a deactivating internal chip enable signal.

9. The mobile device of claim 1, wherein the deactivated semiconductor chips enter a standby state.

10. The mobile device of claim 1, wherein the operation mode information is set within at least one of the plurality of semiconductor chips.

11. The mobile device of claim 1, wherein the operation mode information is set by a bonding or fuse option within the at least one of the plurality of semiconductor chips.

12. The mobile device of claim 1, wherein each deactivated semiconductor chip receives no power when the deactivated semiconductor chip operates in the single-chip mode.

13. The mobile device of claim 1, wherein each deactivated semiconductor chip enters a standby state when the deactivated semiconductor chip operates in the multi-chip mode.

14. The mobile device of claim 1, wherein the semiconductor chips are heterogeneous chips.

15. The mobile device of claim 1, wherein the plurality of semiconductor chips share at least one I/O pin.

16. A mobile device receiving an external chip enable signal and an external address from an external device comprising:

a multi-chip semiconductor memory device including a plurality of semiconductor chips, each semiconductor chip being selectively activated in response to an internal chip enable signal, and at least one chip enable buffer configured to generate the internal chip enable signal; and a logic control device operatively associated with at least one of the plurality of semiconductor chips and the at least one chip enable buffer, the logic control device being configured to activate one of the plurality of semiconductor chips in response to the internal chip enable signal, such that the semiconductor chips in the plurality of semiconductor chips other than the activated semiconductor chip are deactivated semiconductor chips, wherein the at least one chip enable buffer is operatively associated with at least one of the plurality of semiconductor chips and configured to generate the internal chip enable signal in response to an external chip enable signal, an external address, chip identification (ID) information, and operation mode information indicating whether the plurality of semiconductor chips operates in a multi-chip mode or a single-chip mode, and the plurality of semiconductor chips are vertically stacked one on top of the other.

* * * * *